(12) United States Patent
Satake et al.

(10) Patent No.: US 6,737,348 B2
(45) Date of Patent: May 18, 2004

(54) METHOD FOR FORMING BURIED INTERCONNECT

(75) Inventors: Mitsunari Satake, Katano (JP); Masashi Hamanaka, Nara (JP); Hideaki Yoshida, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 169 days.

(21) Appl. No.: 10/120,385

(22) Filed: Apr. 12, 2002

(65) Prior Publication Data

US 2002/0168846 A1 Nov. 14, 2002

(30) Foreign Application Priority Data

May 14, 2001 (JP) ........................................ 2001-142721

(51) Int. Cl.[7] ............................................. H01L 21/461
(52) U.S. Cl. ..................................................... 438/633
(58) Field of Search ................................. 438/622, 624, 438/626, 633, 634, 637, 638, 640, 691, 692

(56) References Cited

U.S. PATENT DOCUMENTS

| | | |
|---|---|---|
| 5,618,381 A | 4/1997 | Doan et al. |
| 6,451,697 B1 * | 9/2002 | Sun et al. .................. 438/691 |

FOREIGN PATENT DOCUMENTS

| | | |
|---|---|---|
| JP | 05-275366 | 10/1993 |
| JP | 10-214834 | 8/1998 |
| JP | 11-145288 | 5/1999 |
| JP | 11-274122 | 10/1999 |
| JP | P2000-164703 A | 6/2000 |
| JP | P2000-235965 A | 8/2000 |
| JP | P2001-44156 A | 2/2001 |
| JP | P2001-308096 A | 11/2001 |

* cited by examiner

*Primary Examiner*—Kamand Cuneo
*Assistant Examiner*—Monica D. Harrison
(74) *Attorney, Agent, or Firm*—McDermott, Will & Emery

(57) ABSTRACT

Holes are formed in a first insulating film deposited on a substrate. After depositing a first conducting film over the first insulating film including the holes, the first conducting film is subjected to first CMP, so as to form plugs from the first conducting film. Next, the first insulating film is subjected to second CMP with a polishing rate of the first insulating film higher than a polishing rate of the first conducting film, so as to planarize the first insulating film by eliminating erosion caused in a region of the first insulating film where the plugs are densely formed. After depositing a second insulating film on the planarized first insulating film, interconnect grooves are formed in the second insulating film. After depositing a second conducting film over the second insulating film including the interconnect grooves, the second conducting film is subjected to third CMP, so as to form buried interconnects from the second conducting film.

3 Claims, 6 Drawing Sheets

METHOD FOR FORMING BURIED INTERCONNECT

BACKGROUND OF THE INVENTION

The present invention relates to a method for forming a buried interconnect, and more particularly, it relates to a method for forming a buried interconnect employed in fabrication of a semiconductor integrated circuit device, in which a plug is formed in a hole formed in a first insulating film, a second insulating film is deposited on the first insulating film and the buried interconnect is formed in an interconnect groove formed in the second insulating film.

A conventional method for forming a buried interconnect will now be described with reference to FIGS. 5A through 5D and 6A through 6D.

First, as shown in FIG. 5A, a first insulating film 2 of, for example, a silicon oxide film with a thickness of, for example, 600 nm is deposited on a semiconductor or insulating substrate 1. Thereafter, as shown in FIG. 5B, holes 3 each with a diameter of, for example, 250 nm are formed in the first insulating film 2 by known lithography and dry etching.

Next, as shown in FIG. 5C, a first underlying film (not shown) composed of a titanium film and a titanium nitride film is deposited over the first insulating film 2 including the inside of the holes 3, and thereafter, a tungsten film 4 with a thickness of, for example, 200 nm is deposited on the first underlying film by CVD.

Then, the tungsten film 4 and the first underlying film are subjected to first CMP (chemical mechanical polishing), so as to form plugs 5 from the tungsten film 4 as shown in FIG. 5D.

In the first CMP, slurry including abrasive particles of, for example, silica and an oxidizing agent of, for example, hydrogen peroxide is used. In this case, the CMP is ideally ended when the surface of the first insulating film 2 is exposed, but over-polishing is generally carried out in consideration of variation in the thickness of the tungsten film 4 and variation in the polishing rate. Therefore, as shown in FIG. 5D, the first insulating film 2 cannot sufficiently work as a polishing stopper in a region where the plugs 5 are densely formed, and hence, erosion is caused in this region. As a result, a surface level difference A is caused.

Next, as shown in FIG. 6A, a second insulating film 6 of, for example, a silicon oxide film with a thickness of, for example, 400 nm is deposited on the first insulating film 2. Thereafter, as shown in FIG. 6B, interconnect grooves 7 are formed in the second insulating film 6 by the known lithography and dry etching.

Then, as shown in FIG. 6C, a second underlying film (not shown) composed of a tantalum film and a tantalum nitride film is deposited over the second insulating film 6 including the inside of the interconnect grooves 7, and thereafter, a copper film 8 is deposited on the second underlying film by, for example, electroplating.

Subsequently, the copper film 8 and the second underlying film are subjected to second CMP, so as to form buried interconnects 9 having a single damascene structure from the copper film 8 as shown in FIG. 6D.

In the region where the plugs are densely formed, however, since the surface level difference A is caused in the first insulating film 2 due to the erosion caused during the first CMP (as shown in FIG. 5D), a surface level difference is caused also in the second insulating film 6 (as shown in FIG. 6A). Therefore, when the buried interconnects 9 are formed by subjecting the copper film 8 to the second CMP, a residual copper film 10 is formed in the region where the plugs are densely formed. As a result, there arises a problem that the buried interconnects 9 are electrically short-circuited through the residual copper film 10.

Although the formation of the residual copper film 10 can be avoided by carrying out excessive over-polishing in the second CMP, the excessive over-polishing results in lowering the height of the buried interconnects 9, so that the line resistance of the buried interconnects 9 cannot satisfy required specification. Accordingly, the excessive over-polishing cannot be carried out in the second CMP.

SUMMARY OF THE INVENTION

In consideration of the aforementioned conventional problem, an object of the invention is preventing electric short-circuit between buried interconnects without carrying out excessive over-polishing in CMP performed on a conducting film to be formed into the buried interconnects.

In order to achieve the object, the first method for forming a buried interconnect of this invention comprises the steps of forming holes in a first insulating film deposited on a substrate; depositing a first conducting film over the first insulating film including the holes and subjecting the first conducting film to first CMP, whereby forming plugs from the first conducting film; planarizing the first insulating film by eliminating erosion caused in a region of the first insulating film where the plugs are densely formed through second CMP carried out on the first insulating film with a polishing rate of the first insulating film higher than a polishing rate of the first conducting film; depositing a second insulating film on the first insulating film after planarization and forming interconnect grooves in the second insulating film; and depositing a second conducting film over the second insulating film including the interconnect grooves and subjecting the second conducting film to third CMP, whereby forming buried interconnects from the second conducting film.

In the first method for forming a buried interconnect, the first insulating film is subjected to the second CMP with a polishing rate of the first insulating film higher than that of the first conducting film, so as to planarize the first insulating film by eliminating the erosion caused in the region of the first insulating film where the plugs are densely formed. Thereafter, the second insulating film used for forming the interconnect grooves is deposited on the first insulating film. Therefore, the buried interconnects can be prevented from being short-circuited through a residual copper film without carrying out excessive over-polishing in the third CMP of the second conducting film. Accordingly, it is possible to avoid the problem of line resistance increase of the buried interconnects derived from lowering of the height thereof.

Japanese Laid-Open Patent Publication No. 5-275366 discloses a technique to carry out second CMP on a first insulating film for eliminating a recess (see FIG. 2) having been formed in a plug through first CMP. However, this technique is employed for eliminating the recess (generally having a depth of approximately 20 nm) formed in the plug and not for eliminating the erosion (generally having a depth of 30 through 100 nm) formed in the region of the first insulating film where the plugs are densely formed as in this first method. It is noted that erosion is not caused and hence need not be eliminated in a region where the plugs are sparsely formed.

In the first method for forming a buried interconnect, in the case where the first insulating film is a silicon oxide film and the first conducting film is a tungsten film, a thickness of the first insulating film to be polished in the second CMP is preferably 50 nm through 150 nm.

Thus, it is possible to definitely eliminate a surface level difference of generally approximately 30 through 100 nm caused due to the erosion of the region of the first insulating film where the plugs are densely formed.

The second method for forming a buried interconnect of this invention comprises the steps of forming holes in a first insulating film deposited on a substrate; depositing a first conducting film over the first insulating film including the holes and subjecting the first conducting film to first CMP, whereby forming plugs from the first conducting film; depositing a second insulating film on the first insulating film and subjecting the second insulating film to second CMP, whereby planarizing the second insulating film by eliminating a surface level difference caused in the second insulating film due to transfer of erosion caused in a region of the first insulating film where the plugs are densely formed; forming interconnect grooves in the second insulating film after planarization; and depositing a second conducting film over the second insulating film including the interconnect grooves and subjecting the second conducting film to third CMP, whereby forming buried interconnects from the second conducting film.

In the second method for forming a buried interconnect, the second insulating film is subjected to the second CMP, so as to eliminate the surface level difference caused in the second insulating film due to the transfer of the erosion caused in the region of the first insulating film where the plugs are densely formed. Thereafter, the interconnect grooves are formed in the second insulating film and then the second conducting film is deposited thereon. Therefore, the buried interconnects can be prevented from being short-circuited through a residual copper film without carrying out excessive over-polishing in the third CMP of the second conducting film. Accordingly, it is possible to avoid the problem of the line resistance increase of the buried interconnects derived from lowering of the height thereof.

DETAILED DESCRIPTION OF THE INVENTION

Embodiment 1

A method for forming a buried interconnect according to Embodiment 1 of the invention will now be described with reference to FIGS. 1A through 1D and 2A through 2D.

Figure 1A:
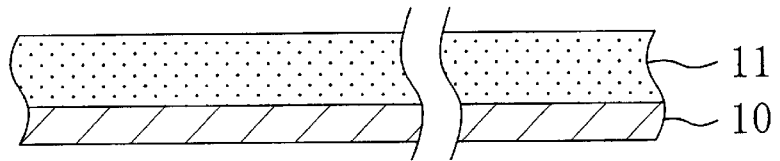
FIGS. 1A, 1B, 1C and 1D are cross-sectional views for showing procedures in a method for forming a buried interconnect according to Embodiment 1 of the invention.
Figure 1B:
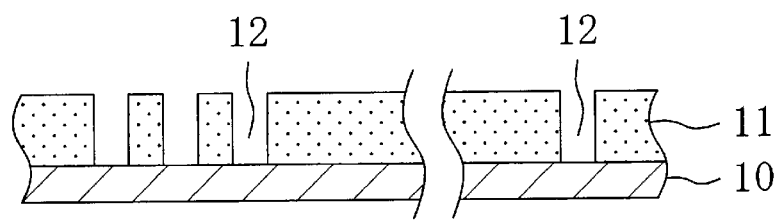

First, as shown in FIG. 1A, a first insulating film 11 of, for example, a silicon oxide film with a thickness of, for example 650 nm is deposited on a semiconductor or insulating substrate 10. Thereafter, as shown in FIG. 1B, holes 12 each with a diameter of, for example, 250 nm are formed in the first insulating film 11 by the known lithography and dry etching.

Figure 1C:
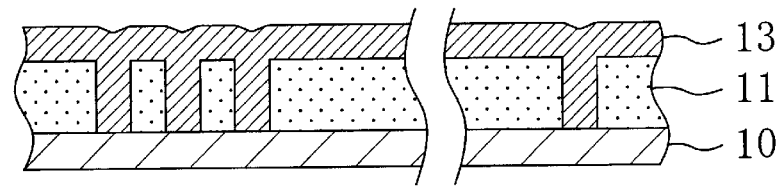

Next, as shown in FIG. 1C, a first underlying film (not shown) composed of a titanium film and a titanium nitride film is deposited over the first insulating film 11 including the inside of the holes 12, and thereafter, a tungsten film (a first conducting film) 13 with a thickness of, for example, 200 nm is deposited on the first underlying film by the CVD.

Figure 1D:
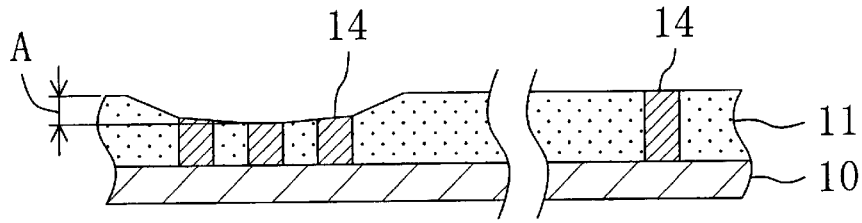

Then, the tungsten film 13 and the first underlying film are subjected to first CMP, so as to form plugs 14 from the tungsten film 13 as shown in FIG. 1D.

In the first CMP, slurry including abrasive particles of, for example, silica and an oxidizing agent of, for example, hydrogen peroxide is used. This slurry is used for polishing the tungsten film 13, and hence, the polishing rate of the first insulating film 11 is small in the first CMP.

As described above, over-polishing is carried out in consideration of the variation in the thickness of the tungsten film 13 and variation in the polishing rate. Therefore, in a region where the plugs 14 are densely formed (namely, a left hand side region in FIG. 1D), since the first insulating film 11 cannot sufficiently work as a polishing stopper, erosion is caused so as to cause a surface level difference A. In contrast, in a region where the plugs 14 are sparsely formed (namely, a right hand side region in FIG. 1D), since the first insulating film 11 sufficiently works as the polishing stopper, no erosion is caused and hence no surface level difference is caused. The value of the surface level difference A, which depends upon the kind of the first insulating film 11, the density of the plugs 14 and the like, is approximately 30 through 100 nm in general.

Figure 2A:
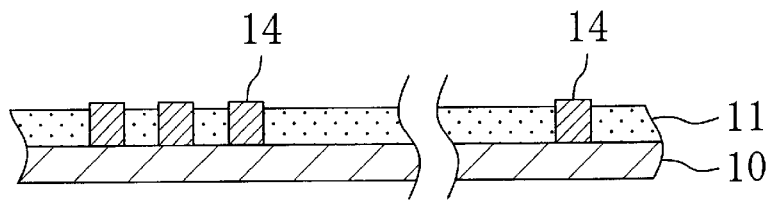
FIGS. 2A, 2B, 2C and 2D are cross-sectional views for showing other procedures in the method for forming a buried interconnect of Embodiment 1.

Next, the first insulating film 11 is subjected to second CMP by using slurry that can exhibit a high polishing rate against the first insulating film 11 but exhibits a lower polishing rate against the plugs 14 made from tungsten. Thus, the first insulating film 11 is planarized as shown in FIG. 2A, so as to eliminate the erosion (surface level difference A).

The slurry used in the second CMP preferably includes silica as abrasive particles and ammonia or potassium hydroxide as a pH adjuster. When the second CMP is carried out by using such slurry, the plugs 14 are minimally polished but the first insulating film 11 is polished at a high polishing rate. Therefore, the first insulating film 11 can be planarized substantially without polishing the plugs 14.

Also, a thickness of the first insulating film 11 to be polished in the second CMP is preferably 50 through 150 nm. Thus, the surface level difference A having been formed in the first insulating film 11 can be definitely eliminated.

Figure 2B:
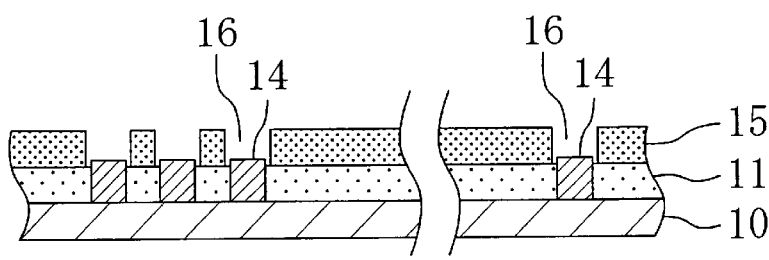

Next, as shown in FIG. 2B, a second insulating film 15 of, for example, a silicon oxide film with a thickness of 400 nm is deposited on the planarized first insulating film 11. Thereafter, interconnect grooves 16 are formed in the second insulating film 15 by the known lithography and dry etching.

Figure 2C:
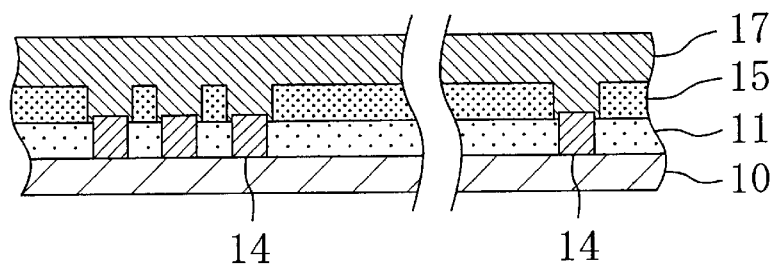

Then, as shown in FIG. 2C, a second underlying film (not shown) composed of a tantalum film and a tantalum nitride film is deposited over the second insulating film 15 including the inside of the interconnect grooves 16, and thereafter, a copper film (a second conducting film) 17 is deposited on the second underlying film by, for example, the electroplating.

Figure 2D:
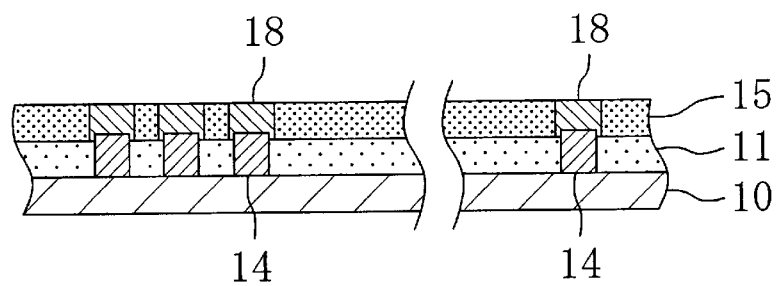

Subsequently, the copper film 17 and the second underlying film are subjected to third CMP, so as to form buried interconnects 18 having a single damascene structure from the copper film 17 as shown in FIG. 2D. Slurry used in the third CMP may include silica as abrasive particles and hydrogen peroxide as an oxidizing agent.

According to Embodiment 1, before the second insulating film 15 is deposited on the first insulating film 11, the first insulating film 11 is planarized by carrying out the second CMP using the slurry exhibiting a high polishing rate against the first insulating film 11 and a low polishing rate against the plugs 14. In other words, the second insulating film 15 is deposited on the first insulating film 11 from which the surface level difference A has been eliminated. Therefore, the buried interconnects 18 can be prevented from being short-circuited through a residual copper film without carrying out excessive over-polishing in the third CMP.

Although the tungsten film 13 is used as the first conducting film for forming the plugs 14 in Embodiment 1, a copper film, a copper alloy film, an aluminum film or an aluminum alloy film may be used instead of the tungsten film.

Embodiment 2

A method for forming a buried interconnect according to Embodiment 2 of the invention will now be described with reference to FIGS. 3A through 3E and 4A through 4D.

Figure 3A:
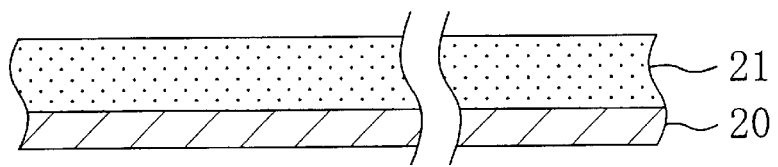
FIGS. 3A, 3B, 3C, 3D and 3E are cross-sectional views for showing procedures in a method for forming a buried interconnect according to Embodiment 2 of the invention.
Figure 3B:
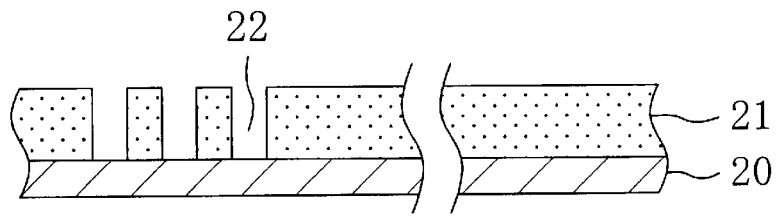

First, as shown in FIG. 3A, a first insulating film 21 of, for example, a silicon oxide film with a thickness of, for example 600 nm is deposited on a semiconductor or insulating substrate 20. Thereafter, as shown in FIG. 3B, holes 22 each with a diameter of, for example, 250 nm are formed in the first insulating film 21 by the known lithography and dry etching.

Figure 3C:
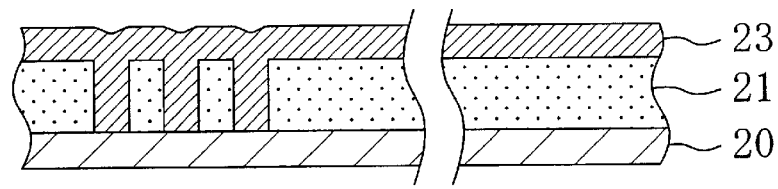

Next, as shown in FIG. 3C, a first underlying film (not shown) composed of a titanium film and a titanium nitride film is deposited over the first insulating film 21 including the inside of the holes 22, and thereafter, a tungsten film (a first conducting film) 23 with a thickness of, for example, 200 nm is deposited on the first underlying film by the CVD.

Figure 3D:
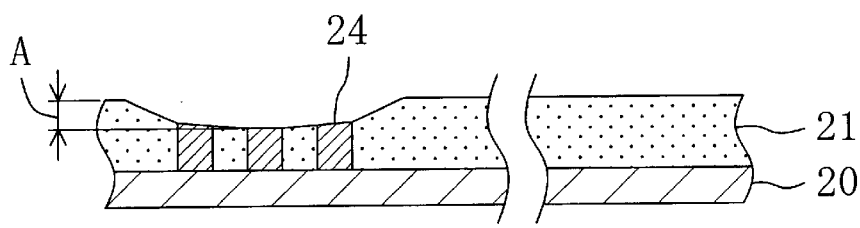

Then, the tungsten film 23 and the first underlying film are subjected to first CMP, so as to form plugs 24 from the tungsten film 23 as shown in FIG. 3D.

In the first CMP, slurry including abrasive particles of, for example, silica and an oxidizing agent of, for example, hydrogen peroxide is used. This slurry is used for polishing the tungsten film 23, and hence, the polishing rate of the first insulating film 21 is small in the first CMP. Also, as described above, over-polishing is carried out in consideration of the variation in the thickness of the tungsten film 23 and variation in the polishing rate. Therefore, in a region where the plugs 24 are densely formed, since the first insulating film 21 cannot sufficiently work as a polishing stopper, erosion is caused so as to cause a surface level difference A. The value of the surface level difference A, which depends upon the kind of the first insulating film 21, the density of the plugs 24 and the like, is approximately 30 through 100 nm in general.

Figure 3E:
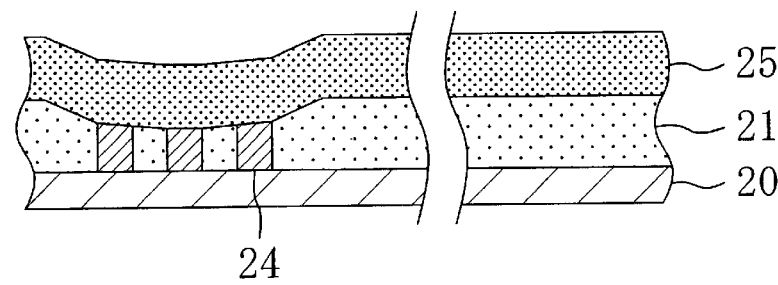

Next, as shown in FIG. 3E, a second insulating film 25 of, for example, a silicon oxide film with a thickness of 600 nm is deposited on the first insulating film 21 having the surface level difference A. Thus, the surface level difference of the first insulating film 21 is transferred to the second insulating film 25, and hence, a surface level difference is caused also in the second insulating film 25.

Figure 4A:
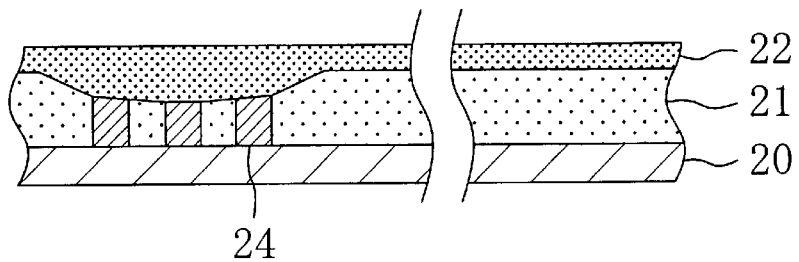
FIGS. 4A, 4B, 4C and 4D are cross-sectional views for showing other procedures in the method for forming a buried interconnect of Embodiment 2.

Then, the second insulating film 25 is subjected to second CMP, so as to planarize the second insulating film 25 as shown in FIG. 4A. Slurry used in the second CMP preferably includes silica as abrasive particles and ammonia or potassium hydroxide as a pH adjuster. When the second CMP is carried out by using such slurry, the second insulating film 25 is planarized at a high polishing rate.

Figure 4B:
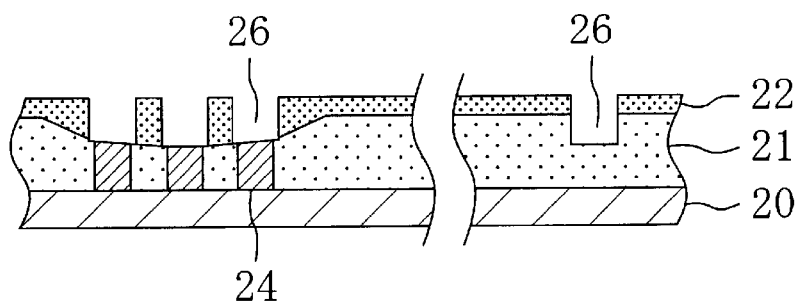

Next, as shown in FIG. 4B, interconnect grooves 26 are formed in the second insulating film 25 by the known lithography and dry etching.

Figure 4C:
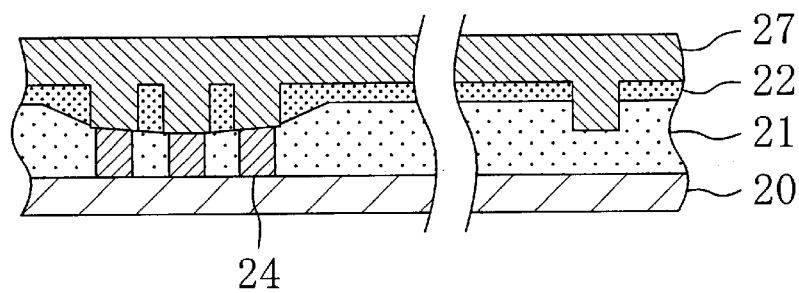

Then, as shown in FIG. 4C, a second underlying film (not shown) composed of a tantalum film and a tantalum nitride film is deposited over the second insulating film 25 including the inside of the interconnect grooves 26, and thereafter, a copper film (a second conducting film) 27 is deposited on the second underlying film by, for example, the electroplating.

Figure 4D:
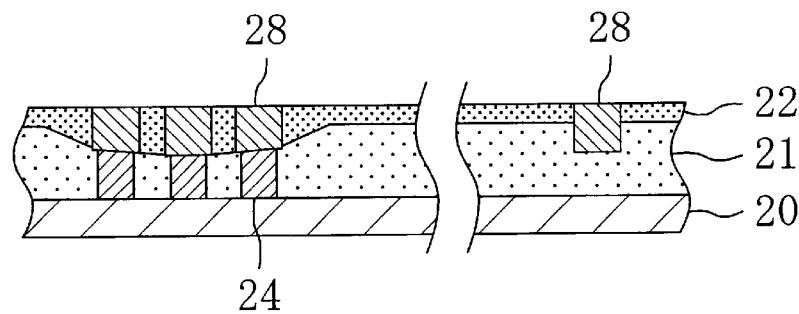
Figure 5A:
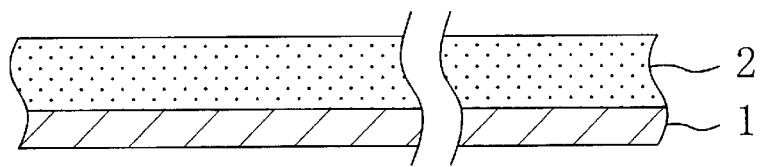
FIGS. 5A, 5B, 5C and 5D are cross-sectional views for showing procedures in a conventional method for forming a buried interconnect.
Figure 5B:
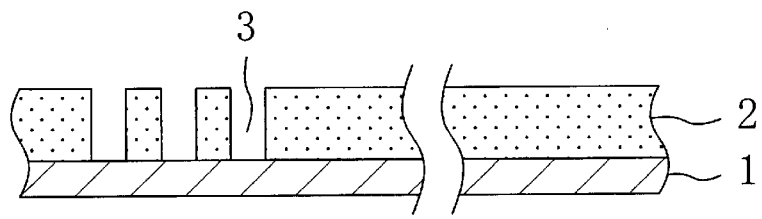
Figure 5C:
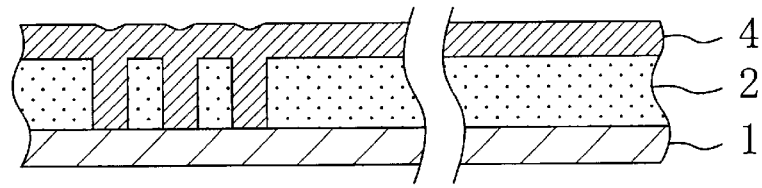
Figure 5D:
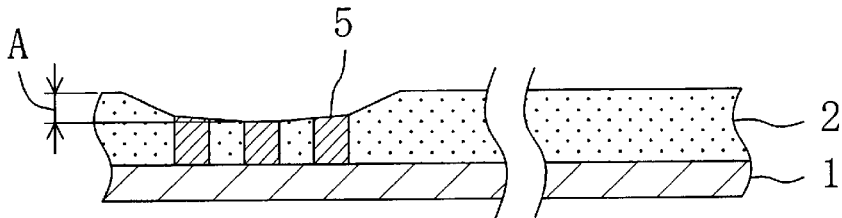
Figure 6A:
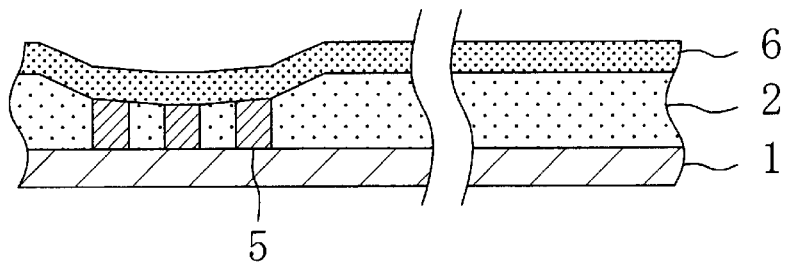
FIGS. 6A, 6B, 6C and 6D are cross-sectional views for showing other procedures in the conventional method for forming a buried interconnect.
Figure 6B:
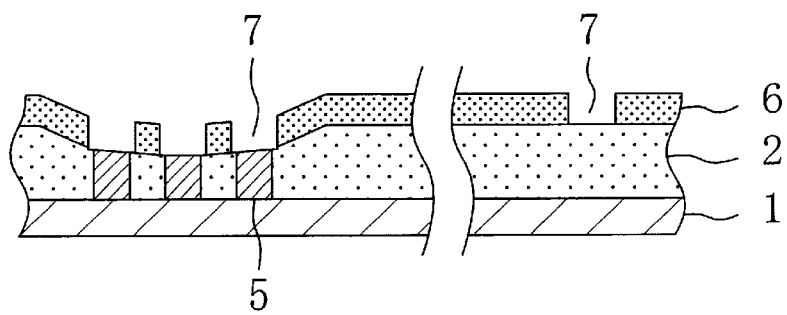
Figure 6C:
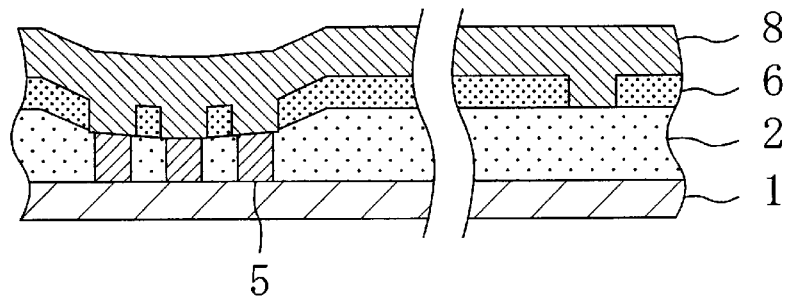
Figure 6D:
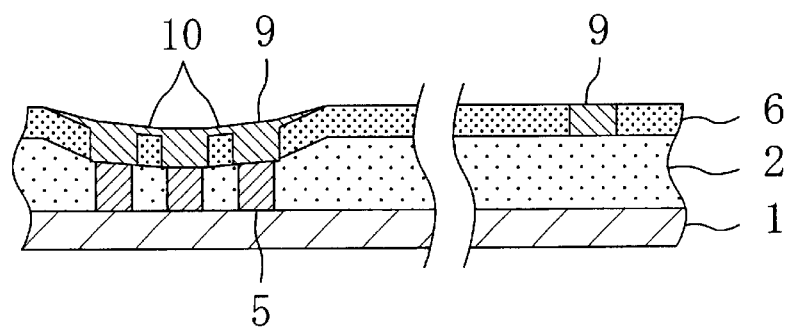

Subsequently, the copper film 27 and the second underlying film are subjected to third CMP, so as to form buried interconnects 28 having a single damascene structure from the copper film 27 as shown in FIG. 4D. Slurry used in the third CMP may include silica as abrasive particles and hydrogen peroxide as an oxidizing agent.

According to Embodiment 2, after planarizing the second insulating film 22 by the second CMP, the interconnect grooves 26 are formed in the planarized second insulating film 22 and then the copper film 27 is deposited. In other words, the copper film 27 is deposited on the planarized second insulating film 22. Therefore, the buried interconnects 28 can be prevented from being short-circuited through a residual copper film without carrying out excessive over-polishing in the third CMP.

Although the tungsten film 23 is used as the first conducting film for forming the plugs 24 in Embodiment 2, a copper film, a copper alloy film, an aluminum film or an aluminum alloy film may be used instead of the tungsten film.

What is claimed is:

1. A method for forming a buried interconnect comprising the steps of:

forming holes in a first insulating film deposited on a substrate;

depositing a first conducting film over said first insulating film including said holes and subjecting said first conducting film to first CMP, whereby forming plugs from said first conducting film;

planarizing said first insulating film by eliminating erosion caused in a region of said first insulating film where said plugs are densely formed through second CMP carried out on said first insulating film with a polishing rate of said first insulating film higher than a polishing rate of said first conducting film;

depositing a second insulating film on said first insulating film after planarization and forming interconnect grooves in said second insulating film; and depositing a second conducting film over said second insulating film including said interconnect grooves and subjecting said second conducting film to third CMP, whereby forming buried interconnects from said second conducting film.

2. The method for forming a buried interconnect of claim 1, wherein said first insulating film is a silicon oxide film and said first conducting film is a tungsten film, and a thickness of said first insulating film to be polished in said second CMP is 50 nm through 150 nm.

3. A method for forming a buried interconnect comprising the steps of:

forming holes in a first insulating film deposited on a substrate;

depositing a first conducting film over said first insulating film including said holes and subjecting said first conducting film to first CMP, whereby forming plugs from said first conducting film;

depositing a second insulating film on said first insulating film and subjecting said second insulating film to second CMP, whereby planarizing said second insulating film by eliminating a surface level difference caused in said second insulating film due to transfer of erosion caused in a region of said first insulating film where said plugs are densely formed;

forming interconnect grooves in said second insulating film after planarization; and depositing a second conducting film over said second insulating film including said interconnect grooves and subjecting said second conducting film to third CMP, whereby forming buried interconnects from said second conducting film.

* * * * *